(12) United States Patent
Langlois

(10) Patent No.: US 10,606,180 B2
(45) Date of Patent: Mar. 31, 2020

(54) EUV CLEANING SYSTEMS AND METHODS THEREOF FOR AN EXTREME ULTRAVIOLET LIGHT SOURCE

(71) Applicant: ASML Netherlands, B.V., Veldhoven (NL)

(72) Inventor: Marc Guy Langlois, San Diego, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 232 days.

(21) Appl. No.: 15/453,884

(22) Filed: Mar. 8, 2017

(65) Prior Publication Data
US 2018/0259861 A1    Sep. 13, 2018

(51) Int. Cl.
G03F 7/20 (2006.01)
H05G 2/00 (2006.01)

(52) U.S. Cl.
CPC ...... *G03F 7/70925* (2013.01); *G03F 7/70033* (2013.01); *H05G 2/005* (2013.01)

(58) Field of Classification Search
USPC ..................................................... 250/504 R
See application file for complete search history.

(56) References Cited

U.S. PATENT DOCUMENTS

| 5,796,111 A | 8/1998 | Mahoney |
| 8,633,459 B2* | 1/2014 | Bykanov ............ G03F 7/70925 250/504 R |
| 2007/0145296 A1 | 6/2007 | Freriks et al. |
| 2013/0126761 A1 | 5/2013 | Nagai et al. |
| 2015/0069273 A1 | 3/2015 | De Dea et al. |

FOREIGN PATENT DOCUMENTS

| TW | 201709304 A | 3/2017 |
| WO | WO/2009/036218 | 3/2008 |
| WO | 2009152885 A1 | 12/2009 |

OTHER PUBLICATIONS

"Hydrogen Aton Beam Source", Dr. Eberl-MBE-Komponenten GmbH HABS, (downloaded on Oct. 11, 2018 from URL https://www.mbe-komponenten.de/products/mbe-components/gas-sources/habs.php.

* cited by examiner

*Primary Examiner* — Phillip A Johnston
(74) *Attorney, Agent, or Firm* — Arent Fox LLP

(57) ABSTRACT

Methods and apparatus for in-situ incline cleaning an element disposed in a EUV generating chamber are disclosed. A capillary-based hydrogen radical generator is employed to form hydrogen radicals from hydrogen gas. The capillary-based hydrogen radical generator is resistively heated during operation and is oriented such that hydrogen radicals catalytically generated from the hydrogen gas are directed to a surface of the element to clean the surface.

20 Claims, 7 Drawing Sheets

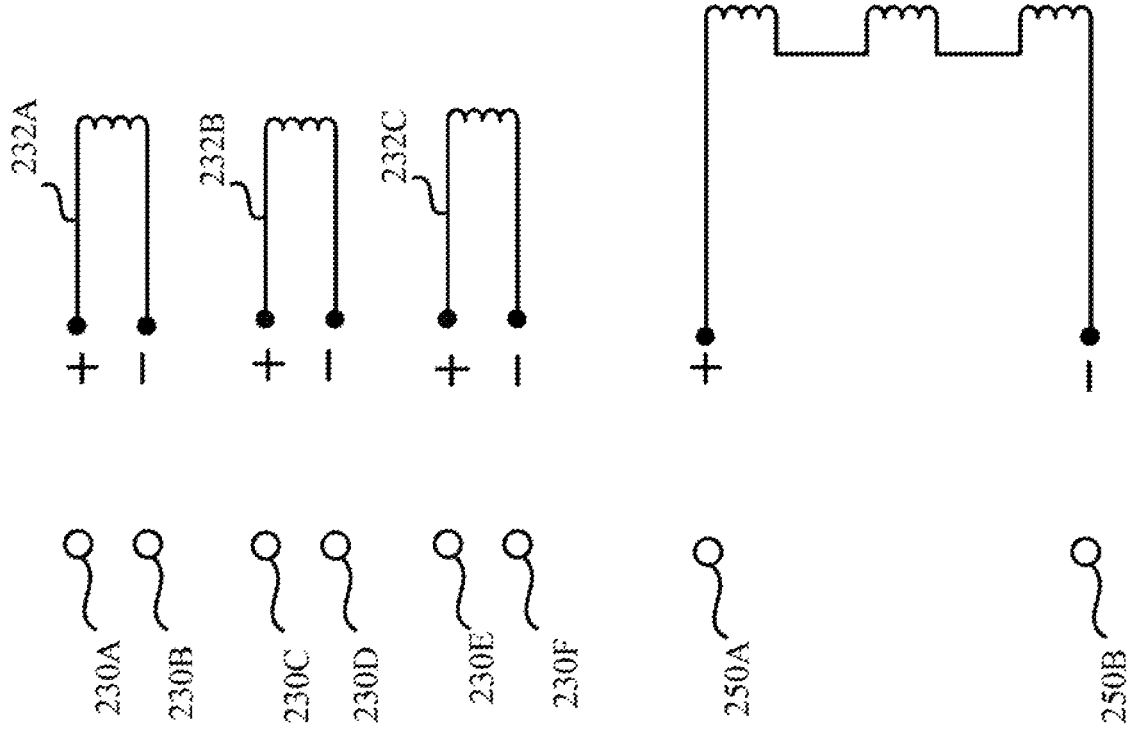

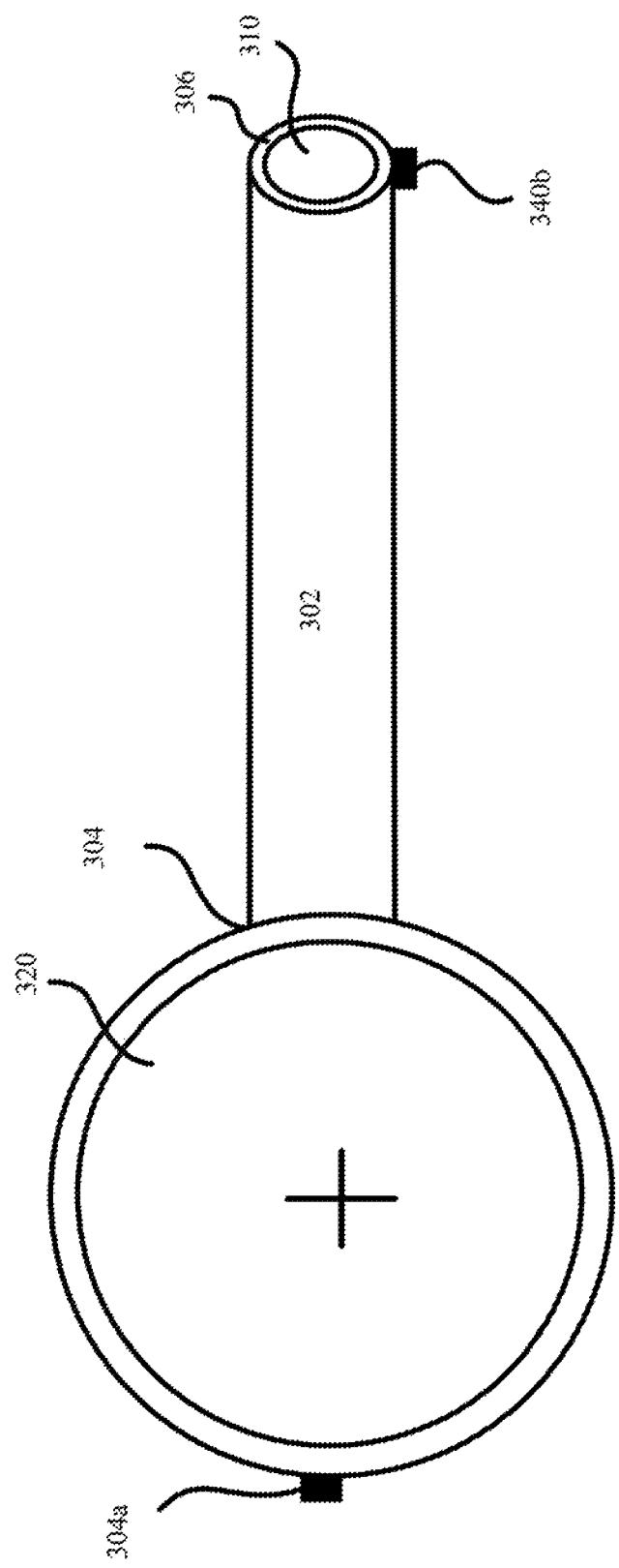

US 10,606,180 B2

EUV CLEANING SYSTEMS AND METHODS THEREOF FOR AN EXTREME ULTRAVIOLET LIGHT SOURCE

BACKGROUND

Extreme ultraviolet ("EUV") light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma can be produced by irradiating a target material, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY OF THE INVENTION

The invention relates in one or more embodiments to the in-situ, inline cleaning of a EUV chamber part using hydrogen radicals that are generated from hydrogen gas. The hydrogen radicals are generated using one or more capillary-based hydrogen radical generators. Each capillary in a capillary-based hydrogen radical generator has a capillary inner surface formed of a catalytic material. The catalytic material is configured to generate, via a thermally-induced catalytic reaction when the catalytic material is heated to a specified temperature range, hydrogen radicals for cleaning the EUV chamber part.

In an embodiment, there is provided an apparatus for generating from hydrogen gas hydrogen radicals for cleaning a surface of an element in a EUV generating chamber. The apparatus includes a first capillary having a first capillary first end and a first capillary second end, the first capillary having at least a first capillary inner surface formed of a catalytic material configured to generate via a thermally-induced catalytic reaction the hydrogen radicals from the hydrogen gas. The apparatus also includes a manifold, the first capillary first end coupling with the manifold to facilitate gaseous transport communication between the manifold and the first capillary first end. The apparatus further includes a first electrical terminal for providing a first voltage to at least one of the first capillary first end and the manifold. The apparatus also includes a second electrical terminal for providing a second voltage to the first capillary second end, thereby resistively heating the first capillary when the first voltage and the second voltage are provided to facilitate the thermally-induced catalytic reaction in the first capillary.

In one or more embodiments, the capillary-based hydrogen radical generator is formed as a one-piece structure from a catalytic material. In one or more embodiments, the capillary-based hydrogen radical generator is a composite structure. In one or more embodiments, the capillary-based hydrogen radical generator comprises multiple gaseous transport channels. In one or more embodiments, a plurality of capillary-based hydrogen radical generators are electrically connected in parallel.

In one or more embodiments, the capillary-based hydrogen radical generators are arranged such that adjacent ones are uniformly spaced apart around the periphery of the EUV chamber part. In one or more embodiments, the capillary-based hydrogen radical generators are grouped together into sets to improve transport of hydrogen radicals to different regions of the EUV chamber part.

In one or more embodiments of the invention, methods for cleaning in-situ and in an inline manner a EUV part using hydrogen radicals generated by capillary-based hydrogen radical generators are disclosed.

BRIEF DESCRIPTION OF THE DRAWINGS

The present in is illustrated by way of example, and not by way of limitation, in the figures of the accompanying drawings and in which like reference numerals refer to similar elements and in which:

FIG. 2B shows a parallel-connected wiring approach for the filament-based hydrogen radical generators.

FIG. 2C shows a series-connected wiring approach for the filament-based hydrogen radical generators.

FIG. 3 shows, in accordance to one or more embodiments of the invention, a capillary-based hydrogen radical generator for generating hydrogen radicals in-situ for inline cleaning of an element (such as a collector mirror surface) in a EUV generating chamber.

DESCRIPTION OF ONE OR MORE EMBODIMENTS

Figure 1:
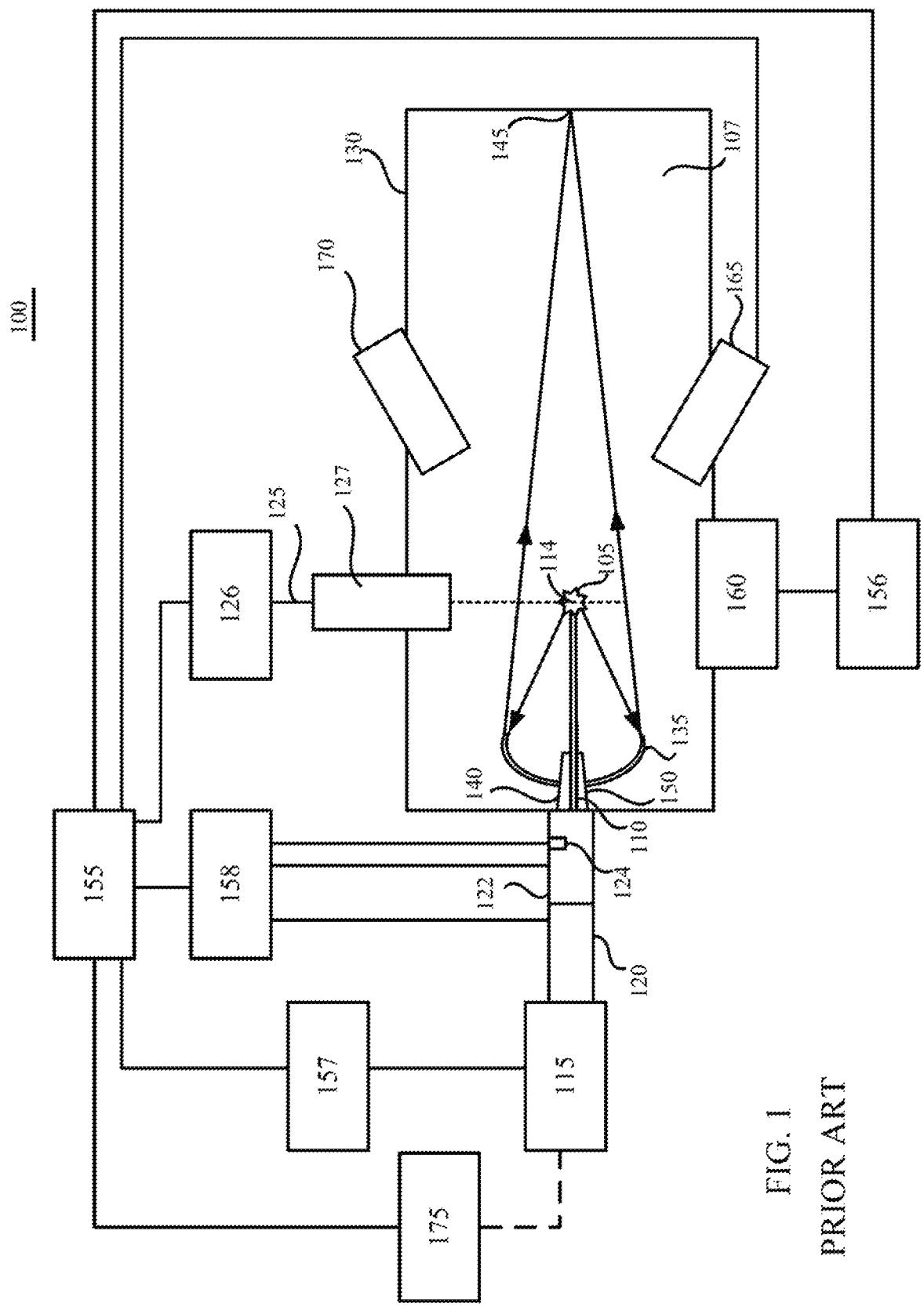
FIG. 1 is a block diagram of an exemplary laser produced plasma extreme ultraviolet (EUV) light source.

The present invention will now be described in detail with reference to a few embodiments thereof as illustrated in the accompanying drawings. In the following description, numerous specific details are set forth in order to provide a thorough and of the present invention. It will be apparent, however, to one skilled in the art, that the present invention may be practiced without some or all of these specific details. In other instances, well known process steps and/or structures have not been described in detail in order to not unnecessarily obscure the present invention.

Methods and apparatus for generating in-situ radicals (or free radicals, as the terms are employed synonymously herein) for in-situ or inline cleaning of a chamber element are disclosed. The radicals combine with debris that collects on a surface of the element to form a gas that can be evacuated, thereby removing the debris from the surface and cleaning the element. The radicals clean the element in an inline manner (e.g., while producing EUV for photolithographic purposes) and in-situ (i.e., without removing the element from its operating environment).

A radical is an atom, molecule, or ion that has an unpaired valence electron or an open electron shell, and, therefore, may be seen as having a dangling covalent bond. The dangling bonds can make radicals highly chemically reactive, that is, a radical can react readily with other substances. Because of their reactive nature, radicals can be used to remove a substance (such as debris) from an object. The radicals can remove the debris by, for example, etching, reacting with, and/or combusting the debris.

In a laser produced plasma (LPP) extreme ultraviolet (EUV) light source, a target mixture is irradiated with an amplified light beam and converted to plasma that emits EUV light. The plasma production process can also produce debris in the form of particles, vapor residue, or pieces of matter that is in the target mixture. This debris can accumulate on the surfaces of objects in the path of the plasma. For example, the target mixture can include molten metal, such as tin, and tin particles and in vapor can accumulate on a collector mirror that is in the path of the plasma.

The presence of the tin debris can reduce the performance of the collector mirror, thus, cleaning the mirror can be beneficial for system performance. However, the collector mirror (and/or other elements in the path of the plasma) is positioned inside of a vacuum chamber in a particular optical alignment. Removing the collector mirror from the EUV light source for cleaning can result in lost system time. Further, interrupting the photolithography process for the purpose of collector mirror cleaning is a time-consuming and expensive undertaking. As mentioned, one or more embodiments of the invention herein aim to clean the element, e.g., the collector mirror, in-situ (without removing the element from the vacuum chamber) and/or inline (during the production of EUV to perform the aforementioned photolithography process).

In one or more embodiments, the hydrogen radicals are generated from hydrogen gas using one or more capillary-based hydrogen radical generators. Each of the capillaries has a capillary inner surface formed of a catalytic material. The catalytic material is configured to generate, via a thermally-induced catalytic reaction when the catalytic material is heated to a specified temperature range, hydrogen radicals from the hydrogen gas. This thermally-induced catalytic reaction phenomenon is well known. In one or more embodiments, the catalytic material is tungsten, iridium, platinum, and/or their oxides and/or mixtures with themselves or other rare earth metals or a similarly suitable catalytic material that can generate, via the thermally-induced catalytic reaction process, hydrogen radicals from hydrogen gas.

In one or more embodiments, the capillary is resistively heated, with one or more capillaries coupled to a common manifold carrying hydrogen gas, to efficiently generate hydrogen radicals for cleaning various parts of the collector mirror.

In one or more embodiments, the entire capillary is formed of the catalytic material (one-piece construction). In one or more embodiments, the capillary may be a composite structure comprising at least an outer layer formed of an outer layer material different from the catalytic material and an inner surface layer formed of the catalytic material. The outer layer material may be any suitable material that is compatible with the EUV generation process. In one or more embodiments, the outer layer material is an alloy that comprises at least nickel and chromium.

In one or more embodiments of the invention, the capillary is a double-walled structure comprising at least a first gaseous transport channel disposed within a second gaseous transport channel such that an interstitial region, is disposed between an exterior surface of the first gaseous transport channel and an interior surface of said the second gaseous transport channel. An example implementation of this design is a conduit-within-a-conduit arrangement that results in an interstitial region in between although. It should be understood that one or more of the conduits can be (but is not required to be or limited to) a generally cylindrical shape. Maintaining temperatures and materials that have low radical recombination can be helpful in the overall efficiency of such an embodiment.

Hydrogen gas is flowed into the first gaseous transport channel for catalytic conversion into hydrogen radicals. Hydrogen gas may also be flowed into the second gaseous transport channel. This hydrogen gas in the second gaseous transport channel may or may not be converted, either partly or wholly, into hydrogen radicals and may also have the role of a carrier medium to help carry the hydrogen radicals further away from the outlet of the first gaseous transport channel. Alternatively or additionally, a carrier gas that is different from hydrogen (such as an inert gas or some other gas that is compatible with the EUV generation process) may be flowed into the second gaseous transport channel to serve a similar carrier gas purpose.

In one or more embodiments, the gas flowed into the second gaseous transport channel is provided at the same volume and/or pressure parameters relative to the gas flowed into the first gaseous transport channel. In one or more embodiments, the gas flowed into the second gaseous transport channel is provided at different volume and/or pressure parameters relative to the gas flowed into the first gaseous transport channel.

In one or more embodiments, the capillaries are arranged around and in a proximal relationship relative to the collector mirror perimeter such that outlets of the capillaries are directed toward the center and/or various regions of the collector mirror for cleaning purposes. In one or more embodiments, the capillaries are arranged such that adjacent ones are uniformly spaced apart. Alternatively or additionally, in one or more embodiments, some or all of the capillaries may be grouped into various sets of capillaries, with each set comprising a plurality of capillaries. The grouping of individual capillaries into a set permits a greater volume of hydrogen radicals and/or mixture of hydrogen radicals and gaseous matter to be formed at the outlets of the capillaries of the set. Such grouping also facilitates shaping the output gas jet. Since hydrogen radicals are relatively light and easily dissipated, this greater volume and/or shaping ensures that at least some of the hydrogen radicals outputted by the capillaries of the set would be, carried far enough into the interior region(s) of the collector mirror to satisfactorily clean such interior region(s).

An example EUV light source is now discussed before discussing the details of the hydrogen radical generating and/or cleaning apparatus and methods in accordance with one or more embodiments of the invention. It should be kept in mind that the EUV light source discussed herein is only exemplary and embodiments of the invention may be readily adapted by one skilled in the art given this disclosure to operate with other EUV light sources as desired.

Referring to FIG. 1, an example LPP EUV light source 100 is shown. The EUV light in LPP EUV light source 100 is formed by irradiating a target mixture 114 at a target location 105 with an amplified light beam 110 that travels along a beam path toward the target mixture 114. The target location 105, which is also referred to as the irradiation site, is within an interior 107 of a vacuum chamber 130. When the amplified light beam 110 strikes the target mixture 114, a target material within the target mixture 114 is convened into a plasma state that has an element with an emission line in the EUV range. The created plasma has certain characteristics that depend on the composition of the target material within the target mixture 114. These characteristics can include the wavelength of the EUV light produced by the plasma and the type and amount of debris released from the plasma.

The light source 100 also includes a target material delivery system 125 that delivers, controls, and directs the target mixture 114 in the form of liquid droplets, a liquid stream, solid particles or clusters, solid particles contained within liquid droplets or solid particles contained within a liquid stream. The target mixture 114 includes the target material such as, for example, water, tin, lithium, xenon, or any material that, when converted to a plasma state, has an emission line in the EUV range. For example, the element tin can be used as pure tin (Sn), as a tin compound, for example, SnBr4, SnBr2, SnH4; as a tin alloy, for example, tin-gallium alloys, tin-indium alloys, tin-indium-gallium alloys, or any combination of these alloys.

The target mixture 114 can also include impurities such as non-target particles. Thus, in the situation in which there are no impurities, the target mixture 114 is made up of only the target material. The target mixture 114 is delivered by the target material delivery system 125 into the interior 107 of the chamber 130 and to the target location 105.

The light source 100 includes a drive laser system 115 that produces the amplified light beam 110 due to a population inversion within the gain medium or mediums of the laser system 115. The light source 100 includes a beam delivery system between the laser system 115 and the target location 105, the beam delivery system including a beam transport system 120 and a focus assembly 122. The beam transport system 120 receives the amplified light beam 110 from the laser system 115, and steers and modifies the amplified light beam 110 as needed and outputs the amplified light beam 110 to the focus assembly 122. The locus assembly 122 receives the amplified light beam 110 and focuses the beam 110 to the target location 105.

In some implementations, the laser system 115 can include one or more optical amplifiers, lasers, and/or lamps for providing one or more main pulses and, in some cases, one or more pre-pulses. Each, optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 115 produces an amplified light beam 110 due to the population inversion in the gain media of the laser amplifiers even if there is no laser cavity. Moreover, the laser system 115 can produce an amplified light beam 110 that is a coherent laser beam if there is a laser cavity to provide enough feedback to the laser system 115. The term "amplified light beam" encompasses one or more of: light from the laser system 115 that is merely amplified but not necessarily a coherent laser oscillation and light from the laser system 115 that is amplified and is also a coherent laser oscillation.

The optical amplifiers in the laser system 115 can include as a gain medium a filling gas that includes $CO_2$ and can amplify light at a wavelength of between about 9100 and about 11000 nm, and in particular, at about 10600 nm, at a gain greater than or equal to 100. Suitable amplifiers and lasers for use in the laser system 115 can include a pulsed laser device, for example, a pulsed, gas-discharge $CO_2$ laser twice producing radiation at about 9300 nm or about 10600 nm, for example, with DC or RE excitation, operating at relatively high power, for example, 10 kW or higher and high pulse repetition rate, for example, 40 kHz or more. The optical amplifiers in the laser system 115 can also include a cooling system such as water that can be used when operating the laser system 115 at higher powers.

Referring again to FIG. 1, the light source 100 includes a collector mirror 135 having an aperture 140 to allow the amplified light beam 110 to pass through and reach the target location 105. The collector mirror 135 can be, for example, an ellipsoidal mirror that has a primary focus at the target location 105 and a secondary focus at an intermediate location 145 (also called an intermediate focus) where the EUV light can be output from the light source 100 and can be input to, for example, an integrated circuit lithography tool (not shown). The light source 100 can also include an open-ended, hollow conical shroud 150 (for example, a gas cone) that tapers toward the target location 105 from the collector mirror 135 to reduce the amount of plasma-generated debris that enters the focus assembly 122 and/or the beam transport system 120 while allowing the amplified light beam 110 to reach the target location 105. For this purpose, a gas flow can be provided in the shroud that is directed toward the target location 105.

The light source 100 can also include a master controller 155 that is connected to a droplet position detection feedback system 156, a laser control system 157, and a beam control system 158. The light source 100 can include one or more target or droplet imagers 160 that provide an output indicative of the position of a droplet, for example, relative to the target location 105 and provide this output to the droplet position detection feedback system 156, which can, for example, compute a droplet position and trajectory from which a droplet position error can be computed either on a droplet by droplet basis or on average. The droplet position detection feedback system 156 thus provides the droplet position error as an input to the master controller 155. The master controller 155 can therefore provide a laser position, direction, and timing correction signal, for example, to the laser control system 157 that can be used, for example, to control the laser timing circuit and/or to the beam control system 158 to control an amplified light beam position and shaping of the beam transport system 120 to change the location and/or focal power of the beam focal spot within the chamber 130.

The target material delivery system 125 includes a target material delivery control system 126 that is operable, in response to a signal from the master controller 155, for example, to modify the release point of the droplets as released by a target material supply apparatus 127 to correct for errors in the droplets arriving at the desired target location 105.

Additionally, the light source 100 can include light source detectors 165 and 170 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 165 generates a feedback signal for use by the master controller 155. The feedback signal can be, for example, indicative of the errors in parameters such as the timing and focus of the laser pulses to properly intercept the droplets in the right place and time for effective and efficient EUV light production.

The light source 100 can also include a guide laser 175 that can be used to align various sections of the light source 100 or to assist in steering the amplified light beam 110 to the target location 105. In connection with the guide laser 175, the light source 100 includes a metrology system 124 that is placed within the focus assembly 122 to sample a portion of light from the guide laser 175 and, the amplified light beam 110. In other implementations, the metrology system 124 is placed within the beam transport system 120. The metrology system 124 can include an optical element that samples or re-directs a subset of the light, such optical element being made out of any material that can withstand the powers of the guide laser beam and the amplified light beam 110. A beam analysis system is formed from the metrology system 124 and the master controller 155 since the master controller 155 analyzes the sampled light from the guide laser 175 and uses this information to adjust components within the focus assembly 122 through the beam control system 158.

Thus, in summary, the light source 100 produces an amplified light beam 110 that is directed along the beam path to irradiate the target mixture 114 at the target location 105 to convert the target material within the mixture 114 into plasma that emits light in the EUV range. The amplified light beam 110 operates at a particular wavelength (that is also referred to as a drive laser wavelength) that is determined based on the design and properties of the laser system 115. Additionally, the amplified light beam 110 can be a laser beam when the target material provides enough feedback hack into the laser system 115 to produce coherent laser light or if the drive laser system 115 includes suitable optical feedback to form a laser cavity.

It may also be useful at this point to discuss some exemplary prior art approaches to generate hydrogen radicals for the purpose of clarifying innovative features and advantages of embodiments of the invention. One prior art approach is to generate hydrogen radicals remotely outside the vacuum chamber and then provide the hydrogen radicals to the collector mirror for cleaning through a series of quartz (or similarly suitable material) conduits. This approach however involves substantial additional hardware for the generation and transport of hydrogen radicals over some non-trivial distance. This approach also suffers from somewhat low efficiency since hydrogen radicals tend to recombine in both the gas phase and upon collision with surfaces such as the interior sidewalls of the long quartz conduits.

Figure 2A:
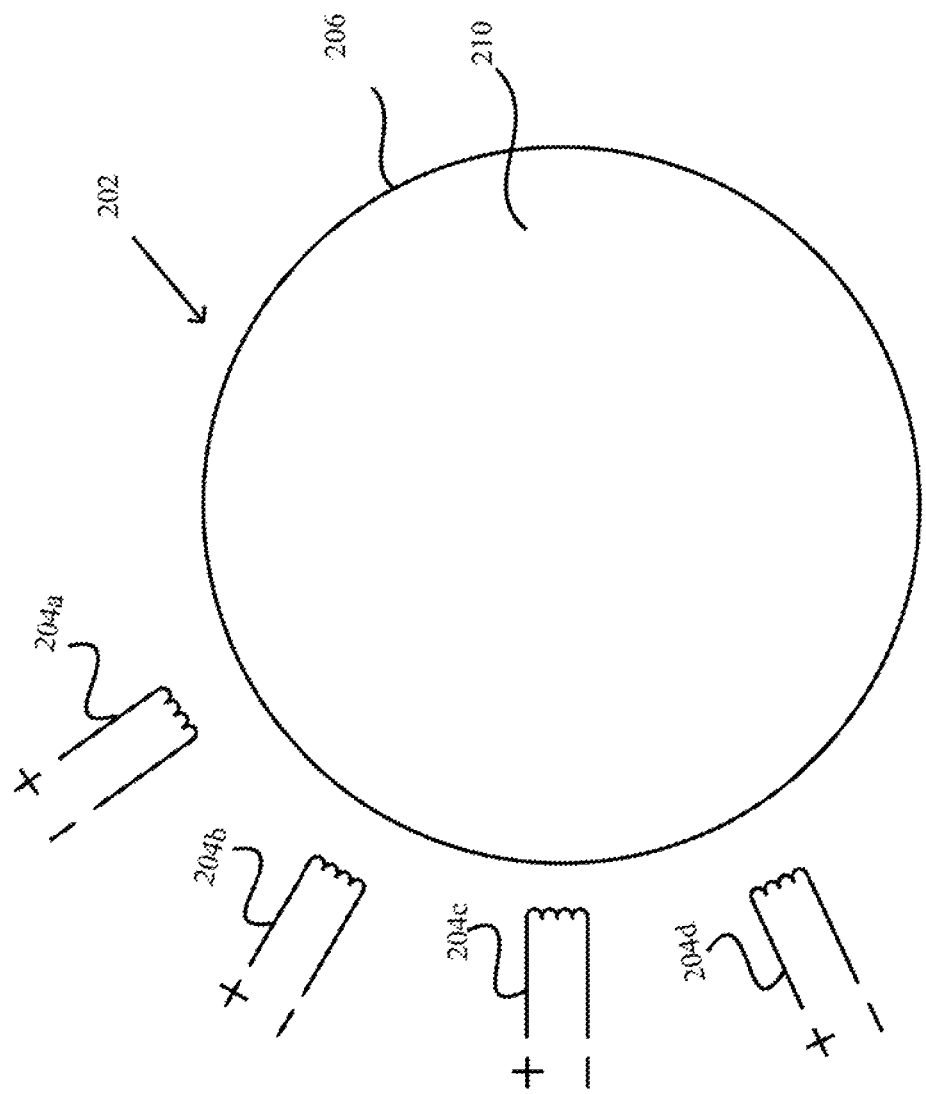
FIG. 2A shows an example filament-based approach for generating hydrogen radicals for cleaning collector mirror.

Another approach is to employ filament-based devices to generate hydrogen radicals in-situ. FIG. 2A shows an example filament-based approach for generating hydrogen radicals for cleaning collector mirror 202. In FIG. 2A, a plurality of filament-based devices 204a, 204b, 204c, and 204d comprising tungsten filaments are arranged around perimeter 206 of collector mirror 202. As can be seen in FIG. 2A, adjacent filament-based devices are uniformly spaced apart. Hydrogen gas is flowed across the tungsten filament of each of filament based devices 204a, 204b, 204c, and 204d while the filaments are heated'in order to convert the hydrogen gas into hydrogen radicals. The direction of the hydrogen flow is from periphery 206 to center 210 of collector mirror, the idea being that any hydrogen radical generated would be directed along the radius of the collector mirror 202 and toward center 210, thereby cleaning collector mirror 202.

However, this approach suffers some disadvantages as well. Since the filament is by its very design relative thin and has a small surface area, not much surface area of the filament is available for catalytic reaction to take place. Additionally, since the flow is unguided, only a small percentage of the hydrogen gas is in contact with the small surface area of the heated filament. Consequently, conversion efficiency tends to be low, around 1% to 5% according to some estimates.

Because of the low efficiency, a large number of filament-based devices need to be employed to generate sufficient hydrogen radicals for cleaning. But this approach wastes energy due to the presence of a large number of heated filaments during use, and the large amount of thermal waste may unduly raise the collector temperature above its specified operating temperature to the detriment of the cleaning effort. This is because the stannane ($SnH_4$) gas formed from tin debris and hydrogen radicals is highly unstable and needs to be pumped away quickly. A hot collector mirror surface increases the rate with which the stannane gas breaks down, resulting in tin being re-deposited again on the collector mirror surface. Managing the thermal budget is a critical issue in EUV chamber operation in general and in collector mirror cleaning in particular.

Another problem with the filament-based approach is the lack of robustness. By their nature, filaments are fragile. Moreover, most filaments tend to be formed from tungsten, and tungsten has been known to crystallize upon being heated. Once crystallized, the crystallized tungsten is highly brittle and fragile. It is not unusual for one or more filament-based devices to fail during shipping or installation of the EUV chamber for these reasons.

Since a large number of filament-based devices tend to be used, it often becomes impractical to electrically connect them in parallel since the parallel-connected approach would necessitate a large number of ports through the chamber wall to accommodate all the electrical connections (assuming two wires per filament-based device). FIG. 2B shows a parallel-connected wiring approach wherein 6 ports 230a-230f would be needed to accommodate the six conductors that couple to three example filament-based devices 232a -232c. Instead, filament-based devices tend to be wired in series with multiple filament-based devices ganged together to minimize the number of ports required through the chamber wall.

In FIG. 2C, filament-based devices 242a-242c are wired in series and consequently only two ports 250a-250b are required. However, this series wiring reduces reliability since the failure of any of filament-based devices 242a-242c would break the electrical continuity and render all other filament-based devices in that serially-connected group inoperative. Another problem with this series connection is the large potential difference required between ports 250a-250h since there are three voltage drops across the three filaments (with the potential difference being even higher if even more than three filament-based devices are coupled in series). The high voltage difference represents a non-trivial risk of arc-related damage to equipment and a safety concern for human operators.

The large number of filament-based devices (because of the low conversion efficiency so many would be required) also necessitates the use of a large number of electrical connectors irrespective whether the series or parallel wiring approach is employed. This has negative implications on reliability since the high temperature difference between the glowing filament and the ambient vacuum chamber means that any electrical connector employed to couple the filament with an electrical conductor must withstand a high temperature variance across the connector. More connectors means more points of possible failure for the filament-based approach.

FIG. 3 shows, in accordance to one or more embodiments of the invention, a capillary-based approach for generating hydrogen radicals in-situ for inline cleaning of the element (such as collector mirror surface) in a EUV generating chamber. A capillary 302 having a first end 304 and a second end 306 is provided. The capillary typically has a relative high aspect ratio (length to capillary cross-section area) such as for example higher than 10:1, more preferably higher than 100:1 and preferably between 750:1 to 2000:1. In an embodiment, the aspect ratio is about +/−10% of 1000:1. The inner surface 310 of the capillary is formed, coated, lined, or generally speaking covered with a material that is capable of providing, when heated to a specified temperature range, the thermally-induced catalytic conversion reaction with hydrogen gas to form hydrogen radical. As mentioned, tungsten or an alloy thereof is one such catalytic material. Other catalytic materials may include iridium, platinum, palladium, their oxides or alloys thereof or any other suitable catalytic material.

The high aspect ratio increases the available capillary inner surface for contact with the hydrogen gas that flows through. In other words, a larger inner surface area would increase the catalytic conversion rate, unlike the situation for the conduits employed to transport the remotely generated hydrogen radicals wherein it is desirable to minimize interaction between the remotely generated hydrogen radicals and the inner walls of the transport conduits. The large catalytic surface area inside the capillary also provides numerous opportunities for the hydrogen gas molecules to catalyze into hydrogen radicals, unlike the situation with the small surface area of the thin filaments.

First end 304 of capillary 302 is coupled to a common manifold 320 in a manner that permits gaseous transport communication between the capillary 302 and manifold 320. Manifold 320 runs in the direction into and out of the page in FIG. 3 and is employed to flow hydrogen gas into a plurality of capillaries 302, each of which is coupled to manifold 320 in an analogous manner. Manifold 320 may be formed of nichrome, stainless steel, molybdenum, carbon, multilayer structures including but not limited to these materials, or a similarly suitable material. In use, a single manifold or multiple manifolds together may surround or substantially surround the periphery of the collector mirror.

Second end 306 is disposed at or proximal to the perimeter of the collector mirror such that when a plurality of capillaries 302 are employed, some or most or all capillaries would be oriented such that their second ends 306 are pointed toward the center of the collector mirror. Some capillaries may however be oriented at another angle relative to the radius of the collector mirror to ensure, that all regions of the collector can be reached by the generated hydrogen radicals for cleaning purposes. However, in an additional embodiment, combinations of capillary hydrogen radical generators may be disposed both from the center to the outside and from the outside to the center of the collector, or other component, to more completely cover the component and provide a more substantial clean area.

Terminals 340a and 340b are provided as electrical connection to receive a potential difference to resistively heat the capillary, with terminal 340a being coupled to the common manifold (or to a common connector that coupled to first ends of the plurality of capillaries if the common manifold is not used as an electrical conductor). Terminal 340b is coupled to the second end (the end facing the collector) of the capillary. In this manner, when an appropriate potential difference is provided across terminals 340a and 340b, capillary 302 is resistively heated to enable its inner wall to perform the aforementioned thermally-induced catalytic reaction process.

It should be noted that when the capillaries are electrically coupled in parallel, the number of electrical connectors is reduced relative to the series-connected approach of the prior art filament-based devices since the number of connectors now is only N+1 instead of 2N, whereby N represents the number of capillaries (assuming all capillaries would be connected together—which in reality is neither a requirement nor a limitation of the invention). In any event, the higher conversion efficiency achieved by the capillaries mean that fewer than N capillary-based devices would be required for generating a given volume of hydrogen radicals (relative to the number of filament-based devices that would be needed). This would reduce the number of electrical connections even further to improve system robustness.

It is anticipated that the conversion efficiency of the capillary-based approach of some embodiments of the invention may be at least twice or many times higher than that of the filament-based approach. In fact, it is anticipated that 80%+ efficiency (i.e., 80% or more of the input hydrogen flow is converted to hydrogen radicals) may be possible for some implementations of the invention given the right combination of parameters for gas flow, catalytic conversion temperature, and proper capillary design.

In one or more embodiments of the invention, the capillary-based hydrogen radical generator is designed in a no manner to minimize wasting heat and the potential for filament flaking or ablation. In other words, outside of the body of the capillary, no filament is employed. In one or more embodiments of the invention, the body of the capillary itself is the heating element. Unlike the situation with the prior art remotely generated hydrogen radical approach, the capillary is disposed within the EUV chamber to locally generate the hydrogen radicals for cleaning. Preferably, the capillary is placed in proximity to the element to be cleaned with the capillary hydrogen radical output directed to the surface to be cleaned.

Figure 4:
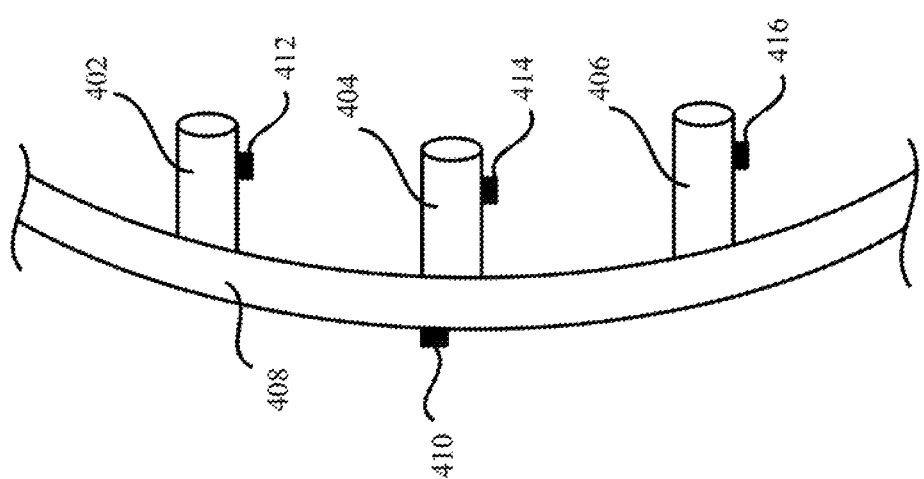
FIG. 4 shows, in accordance to one or more embodiments of the invention, a parallel-connected wiring approach for the capillary-based hydrogen radical generators.

Further, parallel electrical connection is possible with the capillary-based approach. This is shown in example FIG. 4 wherein capillaries 402, 404, and 406 are coupled to manifold 408 and a common terminal (or connector) 410 coupled to the manifold. Terminals (or connectors) 412, 414, and 416 are coupled to capillaries 402, 404, and 406 respectively. Note that even though FIG. 4 shows common terminal 410 being directly coupled to common manifold 408, it is possible to couple common terminal 410 to a common conductor bar that is also electrically coupled the left ends (when viewing FIG. 4) of capillaries 402, 404, and 406. In this manner, when a voltage difference is provided across terminal 410 and the sets of terminals 412, 414, and 416, each of capillaries 402, 404, and 406 is energized. Further, the failure of any parallel-connected capillary (such as 404) would not interrupt the flow of electricity through other parallel-connected capillaries (such as 402 and 406). This parallel connection also negates the need for the high voltage difference across its terminals (as would be required by the series-connected approach). Consequently, the potential for both are related damage and injurious electrical shock to human operators may be diminished in one or more implementations of the invention.

More importantly, the form factor of the capillary is an important advantage of embodiments of the invention.

Although there is no limitation to the exact cross-sectional shape of the capillary as long as a catalytic reaction conduit is provided, a generally cylindrical shape tends to work well for capillaries. With the capillary form factor, the disadvantages associated with the fragility of filaments are avoided. This is important because fragile and/or crystallized filaments have been a sourer of unreliability in the past and the robustness provided by the capillary form factor (with the capillary wall strengthened as needed for robustness) may be an advantage in one or more embodiments of the invention.

Figure 5:
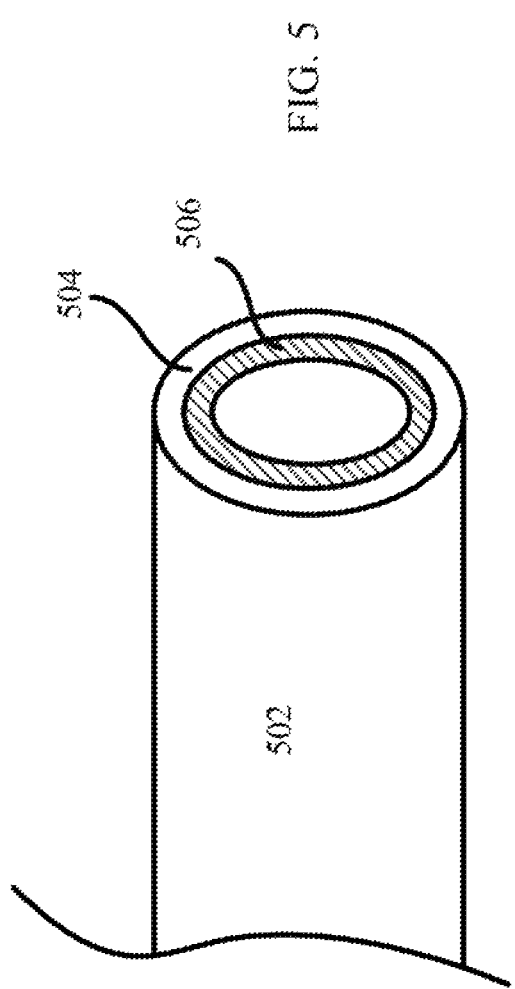
FIG. 5 shows, in accordance to one or more embodiments of the invention, a catalytically lined capillary-based hydrogen radical generator

In an embodiment, the entire capillary may be formed from the catalytic material or an alloy thereof (single-piece construction). However, since many catalytic materials may be difficult to manufacture and work (e.g., some do not weld readily), a composite structure may be desirable. In the composite structure, the outer layer may be formed of a material different from the catalytic material that lines the inner surface of the capillary. This is the example shown in FIG. 5 wherein a composite capillary 502 is comprised of at least an outer layer 504 and an inner layer 506. For example, the outer layer 504 may be formed of nichrome, an alloy that comprises at least nickel and chromium. Alternatively, other suitable outer layer material that is compatible with the EUV generating chamber operating environment such as molybdenum, carbon, multilayer combinations of other metals or alloys suitable for resistive heating may also be employed.

The catalytic material of the inner surface of inner layer 506 may be tungsten or another suitable catalytic material. The electrical terminals provided for resistive heating may be disposed such that electrical current traverses (in the general capillary-end-to-capillary-end direction) across the outer layer, across the catalytic material layer, or both. Alternatively or additionally, resistive heating strips or a heating layer (not shown) formed of a material that is different from either the catalytic material or the outer layer material may be provided outside of the outer layer or more preferably between the outer layer and the catalytic inner wall to provide the resistive heating function.

In this manner, the outer layer may be chosen for its heat insulation or radiant heat containment ability (for reducing the waste heat potentially affecting the collector mirror) and/or for its compatibility with the chamber operating environment and/or for its resistive heating efficiency and/or for its mechanical or manufacturability properties. The catalytic material may be chosen for its high catalytic conversion efficiency without undue concern for some or all of the aforementioned properties, as an example. The heating strips or heating layer (if employed) may be selected for its resistive heating properties for example. Accordingly, fewer performance-reducing compromises need to be made in the design and manufacture of the capillary. It should be pointed out that in some implementations of the invention, the heat insulation ability of the outer layer of the composite capillary (and/or the radiant heat containment ability provided by the outer layer) is an important advantage over the uninsulated filament-based approach, which employs filaments radiating heat unimpeded to the ambient environment within the chamber and/or to the collector mirror. Alternatively or additionally to embodiments herein, active cooling, such as by water on the outside of the insulated or un-insulated outer heat containment section may be provided to reduce the effect of hydrogen radical recombination and increase efficiency in an embodiment of the invention.

Figure 6:
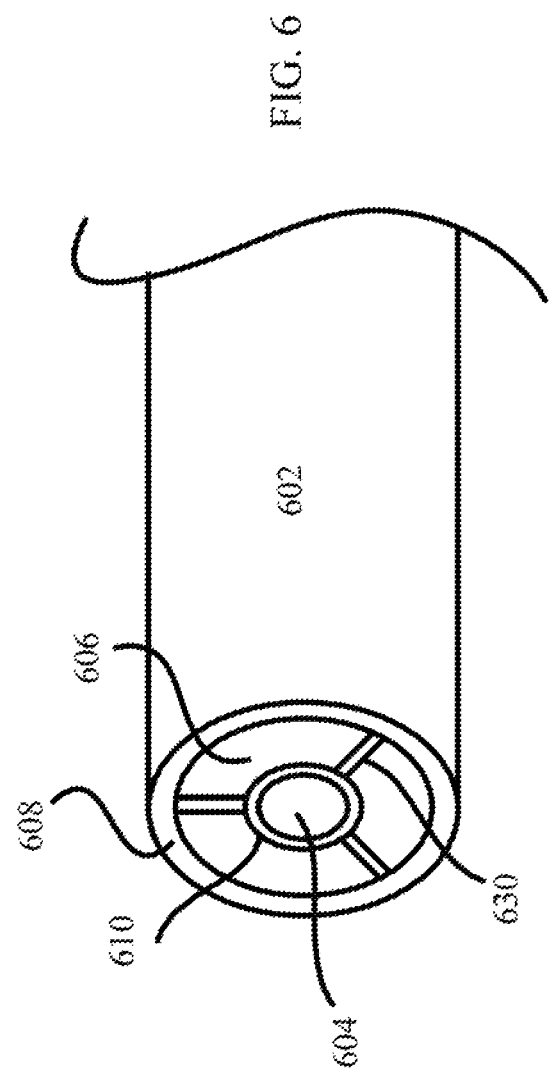
FIG. 6 shows, in accordance with one or more embodiments of the invention, an example of a double-wailed capillary-based hydrogen radical generator.

FIG. 6 shows, in accordance with one or more embodiments of the invention, an example of a double-walled capillary 602 wherein two generally co-axially disposed gaseous transport channels 604 and 606 are provided between outer conduit 608 and inner conduit 610. Inner conduit 610 may be formed of a catalytic material or may be a composite structure as discussed earlier. Outer conduit 608 provides mechanical support and/or thermal containment/insulation and/or functions as the outer enclosure tour gaseous transport channel 606, which occupies the interstitial region between outer conduit 608 and inner conduit 610. Appropriate mechanical strictures 630 may be provided to connect outer conduit 608 and inner conduit 610 together in a spaced-apart relationship while still permitting gas flow through the interstitial region 606.

In use, hydrogen gas is flowed into the first gaseous transport channel 604 for catalytic conversion into hydrogen radicals. Hydrogen gas may also be flowed into the second gaseous transport channel 606. This hydrogen gas in the second gaseous transport channel 606 may or may not be converted, either partially or wholly, into hydrogen radicals (depending on whether a heated catalytic surface is present in the interstitial space, for example) and may act as a carrier medium to help carry the hydrogen radicals generated in one or both of the channels further away from the outlet (the right-side end of FIG. 6) of the double-walled capillary of FIG. 6.

Alternatively or additionally, a carrier gas that is different from hydrogen (such as an inert gas or sonic other gas that is compatible with the EUV production process) may be flowed into the second gaseous transport channel 606 to serve a similar carrier gas purpose. In one or more embodiments, the gas flowed into the second gaseous transport channel 606 is provided at the same volume and/or pressure parameters relative to the gas flowed into the first gaseous transport channel 604. In one or more embodiments, the gas flowed into the second gaseous transport channel 606 is provided at different volume and/or pressure parameters relative to the gas flowed into the first gaseous transport channel 604. In this manner, it is possible to shape the output profile (in term of the shape of the output flow, the total volume of gas outflow, etc.) of the hydrogen radical/carrier gas mixture for best hydrogen radical coverage into the collector mirror interior and across the collector mirror surface. Since the conversion efficiency is much higher relative to the filament-based approach, the addition of the carrier gas does not present a problem for proper EUV generation in the EUV chamber.

The double-wall (or multiple walls since additional co-axially disposed gaseous transport channels may be provided if desired) approach also provides additional advantages with respect to thermal budget management since the outer conduit may serve to further thermally insulate and/or contain the radiant heat to prevent the heat from unduly affecting the ambient temperature of the chamber interior and/or the collector mirror.

Generally speaking, it should be appreciated that the containment of the catalytic material inside the capillary has debris containment advantages. Filaments of the prior art filament-based devices are fragile and may flake off or ablate during use and may contribute further to the debris problem affecting the collector mirror particularly since these materials will not be cleaned by the hydrogen radicals. Since embodiments of the invention enclose such heated catalytic material inside the capillary interior, flaking or ablating is reduced.

It should also be appreciated that the capillary provides the transport function and the guide flow function for the generated hydrogen radicals without unduly suffering the disadvantage of accelerating hydrogen radical recombination. This is because the entire heated catalytic surface of the "guide tube" for the generated hydrogen radicals is itself the site for catalytic conversion. This is unlike the prior art remotely generated hydrogen radical situation wherein the inner surface of the quartz transport tube represents sites for hydrogen radical recombination. This is also an advantage over the filament-based approach since any guide tube provided to guide the hydrogen radicals generated by the filament would present one or more surfaces to increase hydrogen radical recombination and reduce the already low conversion efficiency of the filament-based approach.

In one or more embodiments, physical structures may be provided at the outlet of the capillary to optimize the jet of hydrogen radicals and/or carrier gas for specific purposes such as improving penetration into the collector mirror center region and/or improving coverage across the collector mirror surface and/or creating a specific laminar or turbulent flow profile, etc. The physical structures for such flow optimization may include Venturi effect structures, one or more vanes, and the like. These flow optimization structures may also, if desired in one or more embodiments, be formed of a catalytic material and also resistively heated to further contribute to the overall conversion efficiency.

Figure 7:
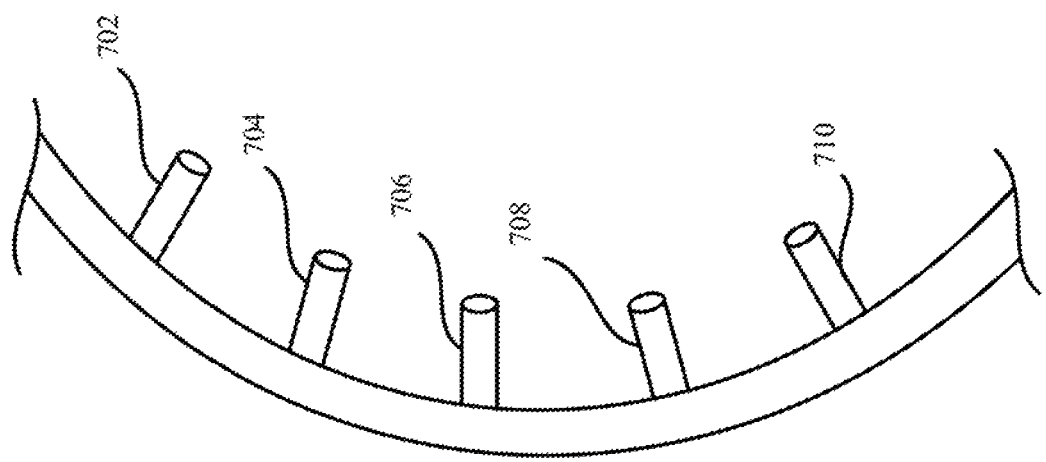
FIG. 7 shows, in accordance to one or more embodiments of the invention, a plurality of capillary-based hydrogen radical generators wherein the spacings between adjacent ones are uniform.

As mentioned, the capillaries may be arranged around and in a proximal relationship relative to the collector mirror perimeter such that outlets of the capillaries are directed toward the center and/or various regions of the collector mirror for cleaning purposes. In one or more embodiments, the capillaries are arranged such that adjacent ones are uniformly spaced apart. This is the example of FIG. 7 wherein capillaries 702, 704, 706, 708, and 710 all have uniform spacing between neighbors.

Figure 8:
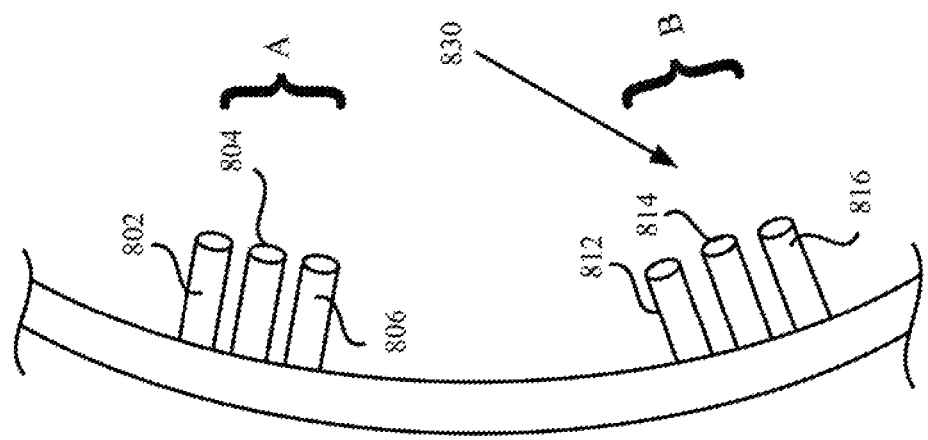
FIG. 8 shows, in accordance to one or more embodiments of the invention, a plurality of capillary-based hydrogen radical generators arranged in sets around the periphery of a collector mirror

Alternatively or additionally, in one or more embodiments, some or all of the capillaries may be grouped into various sets of capillaries, with each set comprising a plurality of capillaries. This is the example of FIG. 8 wherein capillaries 802, 804, and 806 are grouped into set A, and capillaries 812, 814, and 816 are grouped into set B. Note that all the capillaries are not uniformly spaced apart as in the example of FIG. 7 even though each set of the multiple sets may be uniformly spaced apart from one another (if desired and not a requirement) around the perimeter of the collector mirror.

The grouping of individual capillaries (such as 812, 814, and 816) into a set (such as set B) permits a greater volume of hydrogen radicals and/or mixture of hydrogen radicals and gaseous matter to be formed at the outlet end 830 of the capillaries of the set. Since hydrogen radicals are relatively light and easily dissipated, this greater volume of flow ensures that at least sonic of the hydrogen radicals outputted by the capillaries of the set would be carried far enough into the interior region(s) of the collector mirror to satisfactorily clean such interior region(s).

Embodiments of the invention also include methods for cleaning in-situ and in an inline manner an element inside the EUV chamber. The element may be, for example, a collector mirror. The method includes providing one or more of the aforementioned capillary-based hydrogen radical generators that are coupled to a common manifold in the EUV chamber. The method additionally includes flowing hydrogen gas into the common manifold. The method may optionally include flowing a carrier gas into the capillary-based hydrogen radical generators in the manner discussed above. The method further includes providing electrical power to the capillary-based hydrogen radical generators to resistively heat the catalytic capillary inner wall and to generate the hydrogen radicals. The method also includes cleaning the element with the hydrogen radicals and pumping away the exhaust gas that is formed from the hydrogen radicals and any debris.

As can be appreciated from the foregoing, embodiments of the it improve the conversion efficiency, enhance the robustness of the hydrogen radical generating apparatus to improve mechanical and electrical reliability, and reduce thermal waste. More importantly, some embodiments of the invention may be easily optimized to shape and guide the hydrogen radical flow toward any region (including the center region) of the collector mirror to improve cleaning while avoiding the hydrogen radical recombination penalty when shaping/guiding. Such factors may contribute to a more robust and efficient in-situ, inline cleaning technique, allowing the EUV chamber and more specifically the collector mirror to stay clean and operate longer than possible using the prior art approaches.

While this invention has been described in terms of several preferred embodiments, there are alterations, permutations, and equivalents, which fall within the scope of this invention. The invention should be understood to also encompass these alterations, permutations, and equivalents. It should also be noted that there are many alternative ways of implementing the methods and apparatuses of the present invention. Although various examples are provided herein, it is intended that these examples be illustrative and not limiting with respect to the invention.

What is claimed is:

1. Apparatus for generating from hydrogen gas hydrogen radicals for cleaning an element disposed within a EUV generating chamber, comprising:
   a first capillary disposed within said EUV generating chamber, said first capillary having a first capillary first end and a first capillary second end, said first capillary having at least a first capillary inner surface formed of a catalytic material configured to generate via a thermally-induced catalytic reaction said hydrogen radicals from said hydrogen gas;
   a manifold, said first capillary first end coupling with said manifold to facilitate gaseous transport communication between said manifold and said first capillary first end;
   a first electrical terminal for providing a first voltage to at least one of said first capillary first end and said manifold; and
   a second electrical terminal for providing a second voltage to said first capillary second end, thereby configured for resistively heating said first capillary when said first voltage and said second voltage are provided to facilitate said thermally-induced catalytic reaction in said first capillary.

2. The apparatus of claim 1 wherein said first capillary is a composite structure having an outer layer formed of a material different from said catalytic material.

3. The apparatus of claim 2 wherein said material different from said catalytic material is an alloy that comprises at least nickel and chromium.

4. The apparatus of claim 3 wherein said catalytic material is formed of a material that comprises at least tungsten.

5. The apparatus of claim 2 wherein said catalytic material is formed of a material that comprises at least tungsten.

6. The apparatus of claim 1 further comprising a second capillary having a second capillary first end and a second capillary second end, said second capillary having at least a second capillary inner surface formed of said catalytic material, said second capillary first end coupling with said manifold to facilitate gaseous transport communication between said manifold and said second capillary first end, a third electrical terminal for providing said second voltage to said second capillary second end, thereby configured for resistively heating said second capillary when said first voltage and said second voltage are provided to facilitate said thermally-induced catalytic reaction in said second capillary.

7. The apparatus of claim 1 wherein said first capillary is a double-walled structure comprising a first gaseous transport channel disposed within a second gaseous transport channel such that an interstitial region is disposed between an exterior surface of said first gaseous transport channel and an interior surface of said second gaseous transport channel.

8. The apparatus of claim 1 wherein said first gaseous transport channel is configured to receive said hydrogen gas at a first pressure, said second transport channel is configured to receive said hydrogen gas at a second pressure different from said first pressure.

9. The apparatus of claim 1 wherein said first gaseous transport channel is configured to receive a first gas that comprises at least said hydrogen gas and said second transport channel is configured to receive a second gas that comprises at least said hydrogen gas and at least one other gas.

10. The apparatus of claim 9 wherein said first gaseous transport channel is configured to receive said first gas at a first pressure and said second transport channel is configured to receive said second gas at a second pressure different from said first pressure.

11. The apparatus of claim 1 further comprising a plurality of other capillaries for generating said hydrogen radicals, each of said plurality of said other capillaries having at least one end coupled to said manifold, said plurality of other capillaries being spatially grouped to form a plurality of sets, individual sets of said plurality of sets being spatially distributed in a non-uniform manner along said manifold.

12. The apparatus of claim 1 wherein the first capillary lacks exposed filaments.

13. Apparatus for generating hydrogen radicals for cleaning an element disposed within a EUV generating chamber, the apparatus comprising:

a first capillary disposed within said EUV generating chamber, said first capillary having a first capillary first end and a first capillary second end, said first capillary having at least a first capillary inner surface comprising a catalytic material configured to generate said hydrogen radicals via a thermally-induced catalytic reaction of hydrogen gas;

a manifold, said first capillary first end coupling with said manifold to facilitate gaseous transport communication between said manifold and said first capillary first end;

a first electrical terminal for providing a first electrical connection to a first voltage to at least one of said first capillary first end and said manifold; and a second electrical terminal for providing a second electrical connection to a second voltage to said first capillary second end, the first electrical terminal and the second electrical terminal being arranged so that a current flows through the first capillary when the first electrical terminal is connected to the first voltage and the second electrical terminal is connected to the second voltage, said first capillary being configured to heat by resistive heating when the current flows through the first capillary.

14. The apparatus of claim 13 wherein said first capillary is a composite structure having an outer layer formed of a material different from said catalytic material.

15. The apparatus of claim 14 wherein said material different from said catalytic material is an alloy that comprises at least nickel and chromium.

16. The apparatus of claim 13 wherein said catalytic material is formed of a material that comprises at least tungsten.

17. The apparatus of claim 14 wherein said catalytic material is formed of a material that comprises at least tungsten.

18. The apparatus of claim 1 further comprising a second capillary having a second capillary first end and a second capillary second end, said second capillary having at least a second capillary inner surface formed of said catalytic material, said second capillary first end coupling with said manifold to facilitate gaseous transport communication between said manifold and said second capillary first end, a third electrical terminal for providing said second voltage to said second capillary second end, thereby configured for resistively heating said second capillary when said first voltage and said second voltage are provided to facilitate said thermally-induced catalytic reaction in said second capillary.

19. The apparatus of claim 18 wherein said second capillary is a composite structure having an outer layer formed of a material different from said catalytic material.

20. The apparatus of claim 19 wherein said material different from said catalytic material is an alloy that comprises at least nickel and chromium.

\* \* \* \* \*